(12) United States Patent
Kim

(10) Patent No.: US 7,306,992 B2
(45) Date of Patent: Dec. 11, 2007

(54) FLASH MEMORY DEVICE AND METHOD OF FABRICATING THE SAME

(75) Inventor: Ki Seog Kim, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 136 days.

(21) Appl. No.: 11/158,909

(22) Filed: Jun. 21, 2005

(65) Prior Publication Data

US 2006/0258102 A1   Nov. 16, 2006

(30) Foreign Application Priority Data

May 12, 2005   (KR) .................... 10-2005-0039859

(51) Int. Cl.
*H01L 21/336* (2006.01)

(52) U.S. Cl. .................. 438/261; 438/596; 257/E21.68

(58) Field of Classification Search ................ 438/261, 438/267, 304, 593, 594, 596; 257/E21.68, 257/E21.681

See application file for complete search history.

(56) References Cited

U.S. PATENT DOCUMENTS

| 5,138,573 | A | * | 8/1992 | Jeuch | 257/316 |
| 5,208,175 | A | * | 5/1993 | Choi et al. | 438/261 |
| 6,133,601 | A | * | 10/2000 | Watanabe | 257/314 |
| 6,432,773 | B1 | * | 8/2002 | Gerber et al. | 438/261 |

FOREIGN PATENT DOCUMENTS

| KR | 2002-0052611 A | 7/2002 |
| KR | 2005-0038752 A | 4/2005 |

* cited by examiner

*Primary Examiner*—Chandra Chaudhari
(74) *Attorney, Agent, or Firm*—Townsend and Townsend and Crew LLP

(57) ABSTRACT

A flash memory device includes control gates that are formed to completely surround the top and sides of floating gates. The control gates are located between the floating gates that are adjacent in the word line direction as well as the floating gates that are adjacent in the bit line direction. The present flash memory device reduces a shift in a threshold voltage resulting from interference among floating gates and increases an overlapping area of the floating gate and the control gates. Thus, there is an effect in that the coupling ratio can be increased.

7 Claims, 3 Drawing Sheets

FLASH MEMORY DEVICE AND METHOD OF FABRICATING THE SAME

CROSS-REFERENCES TO RELATED APPLICATIONS

The present application claims priority to Korean Patent Application No. 10-2005-0039859, filed May 12, 2005, which is incorporated by reference.

BACKGROUND OF THE INVENTION

The present invention relates to flash memory devices, and more specifically, to flash memory devices and method of fabricating the same, wherein interference among floating gates can be reduced and the coupling ratio can be enhanced.

The size of flash memory cells preferably needs to be made smaller and smaller. However, the technology innovations and improvements needed to enable such device shrinkage are becoming more and more difficult to achieve in part due to the limits associated with patterning technology and equipment.

As a result, much research has been done on a multi-bit cell technology, in which a plurality of data can be stored in one memory cell. This type of a memory cell is called a "multi-level cell (MLC)".

A MLC generally has two or more threshold voltages, and also has two or more data storage states corresponding to them.

FIG. 1 is a view showing a data storage state of a multi-level cell.

As shown in FIG. 1, a MLC into which data of 2 bits can be programmed has four data storage states, i.e., "11", "10", "01" and "00". Distribution of them corresponds to distribution of threshold voltages of the MLC, respectively. For example, assuming that distribution of threshold voltages of a memory cell is −2.7 V or less, 0.3 to 0.7 V, 1.3 to 1.7 V and 2.3 to 2.7 V, "11" corresponds to −2.7 V or less, "10" corresponds to 0.3 to 0.5 V, "01" corresponds to 1.3 to 1.7 V and "00" corresponds to 2.3 to 2.7 V. That is, if the threshold voltage of the MLC corresponds to one of the four threshold voltages, data information of 2 bits corresponding to one of "11", "10", "01" and "00" is stored in the memory cell.

Therefore, it is necessary to finely control distribution of threshold voltages in each level. For example, the range for one level has to be controlled to about 1 V. To this end, although sensing margin is related to a program pulse step, the range has to be controlled to about 0.2 V.

If the range for one level or sensing margin is too finely controlled, however, the performance of a product can be degraded. If a unique threshold voltage shift of a cell is controlled to about 0.2 V, a threshold voltage that must be controlled is less than 0.4 V.

In order to attain this threshold voltage, a threshold voltage that can be controlled most ideally cannot be controlled to be about less than 0.2 V when considering that it is related to a program pulse step.

In this case, in consideration of block pattern dependency, a shift in a threshold voltage due to the interference effect depending upon a state of a surrounding cell has to be controlled to about 0.05 V or less.

FIG. 2 is a graph showing a threshold voltage shift (dVt) value according to the interference effect depending upon shrinkage of the cell size.

As shown in FIG. 2, a threshold voltage value (dVt) that varies due to neighboring cells in a bit line direction is 0.05 V or less, which is not a significant problem. However, a threshold voltage value (dVt) that varies due to neighboring cells in a word line direction is 0.3 to 0.5 V. This makes it difficult to implement a MLC cell.

BRIEF SUMMARY OF THE INVENTION

Accordingly, the present invention relates to providing flash memory devices and method of fabricating the same, wherein a shift in a threshold voltage due to the interference effect of neighboring cells can be reduced.

According to an aspect of the present invention, there is provided a flash memory device, including a semiconductor substrate, a tunnel dielectric film formed on the semiconductor substrate, floating gates, which are formed on the tunnel dielectric film and are separated in an island shape on a cell basis, an interlayer dielectric film formed on the entire surface including the floating gates, and control gates, which are formed on the interlayer dielectric film and arranged in one direction while surrounding the top and sides of the floating gates.

A width of the control gates in the other direction perpendicular to the one direction preferably corresponds to the sum of a width of the floating gates in the other direction, a twice of a thickness of the interlayer dielectric film, and overlay margin.

The overlay margin is preferably the sum of a minimum thickness of the control gates that are formed at both sides of the floating gates in the other direction and misalignment margin.

The minimum thickness of the control gates that are formed at both sides of the floating gates in the other direction is preferably 10 nm.

The floating gates can be a square, circular, elliptical or polygonal shape.

According to an aspect of the present invention, there is provided a method of fabricating a flash memory device, including the steps of forming a tunnel dielectric film on a semiconductor substrate in which an active region and a field region are defined by means of isolation films, forming floating gates, which are separated in an island shape on a cell basis, on the active region and the field region adjacent to the active region, forming an interlayer dielectric film on the entire surface, forming an electrode material for control gate on the interlayer dielectric film, and patterning the electrode material for control gates to form control gate lines that completely surround the top and sides of the floating gates.

The method can further include the steps of after forming the electrode material for control gate, forming a hard mask film pattern on a predetermined region of the electrode material for control gate, and forming a hard mask spacer at the sides of the hard mask film pattern. At this time, in patterning the electrode material for control gate, the hard mask film pattern and the hard mask spacer are used as masks.

The hard mask film and the hard mask spacer can be formed using an oxide film.

The method can further include the step of performing a re-oxidization process for mitigating etch damage after the control gates are formed.

The tunnel dielectric film is preferably formed using an oxide film, and the interlayer dielectric film is formed using an oxide film, or a stack film of an oxide film and a nitride film.

The floating gates and the control gates can be formed using polysilicon or a metal compound.

DETAILED DESCRIPTION OF PREFERRED EMBODIMENTS

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments.

Figure 1:
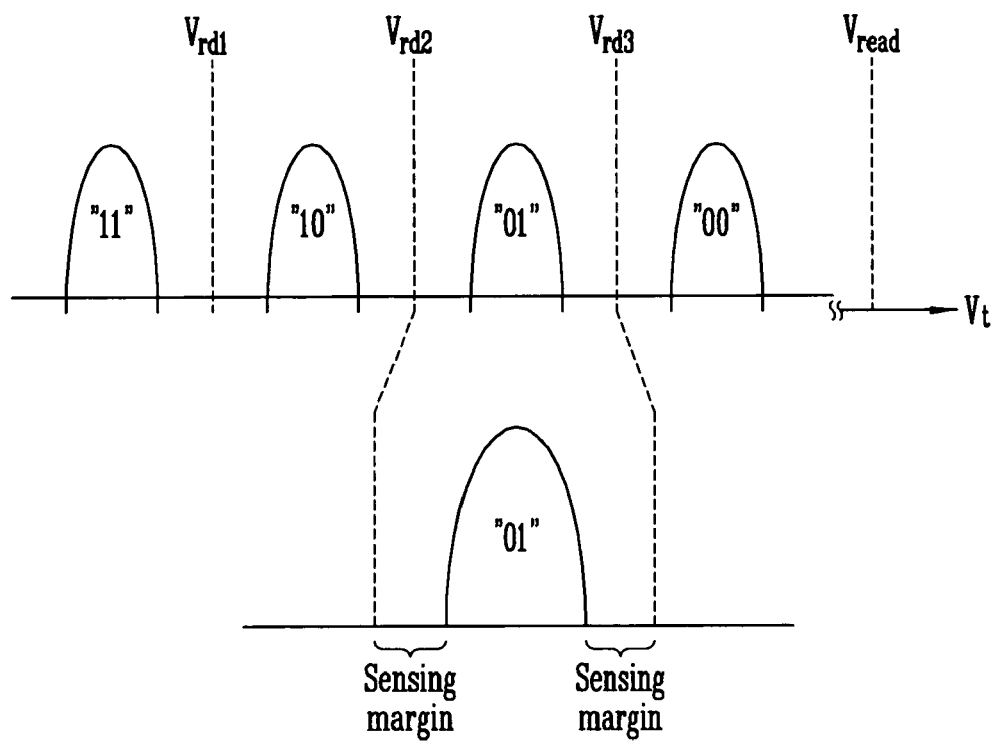
FIG. 1 is a view showing a data storage state of a multi-level cell.
Figure 2:
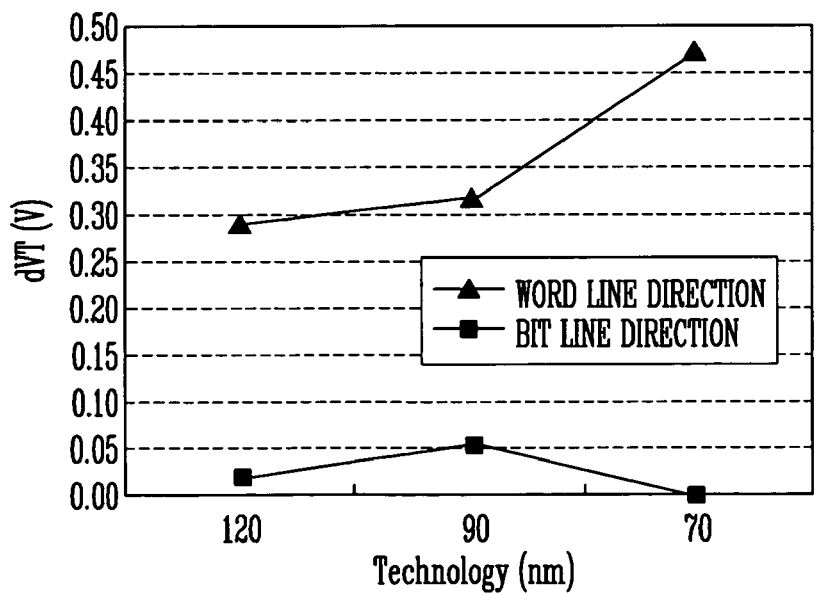
FIG. 2 is a graph showing a shift (dVt) in a threshold voltage according to the interference effect depending upon shrinkage of the cell size.
Figure 3:
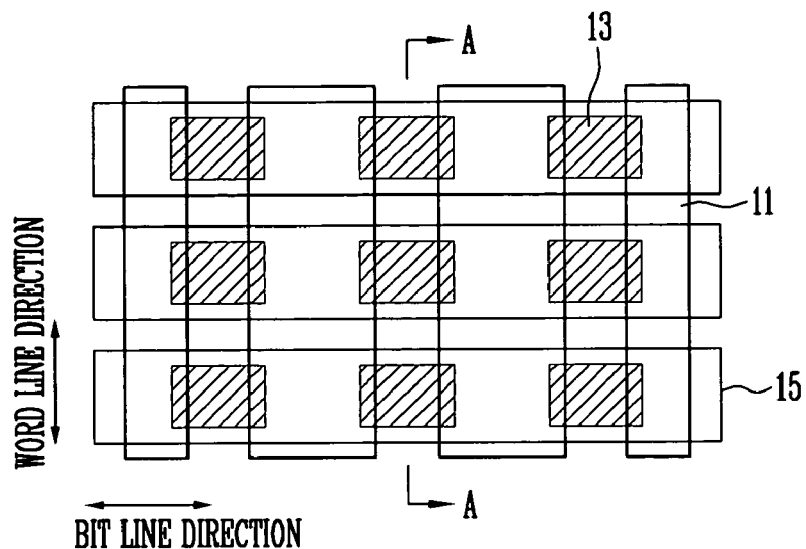
FIG. 3 is a plan view showing a flash memory device according to an embodiment of the present invention.
Figure 4:
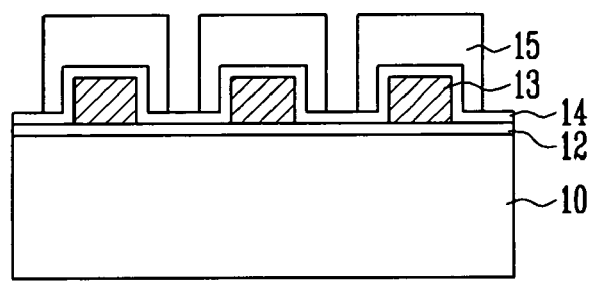
FIG. 4 is a cross-sectional view of the flash memory device taken along line A-A in FIG. 3.

FIG. 3 is a plan view showing a flash memory device according to an embodiment of the present invention. FIG. 4 is a cross-sectional view of the flash memory device taken along line A-A in FIG. 3.

Referring to FIGS. 3 and 4, isolation films 11 of a stripe pattern, which are arranged in a word line direction, divide a semiconductor substrate 10 into an active region and a field region. A tunnel dielectric film 12 is formed along a surface of the semiconductor substrate 10 in which the isolation films 11 are formed. A plurality of floating gates 13, which are separated on a cell basis and have an island shape, is formed in the active region and the field region adjacent to it. An interlayer dielectric film 14 is formed on the semiconductor substrate 10 including the floating gates 13, control gates 15 of a stripe pattern is formed to completely surround the top and sides of the floating gates 13 in a bit line direction perpendicular to the word line direction.

In the case of an existing flash memory device, control gates are located between floating gates that are adjacent in the bit line direction. Since the floating gates are etched simultaneously with etching of the control gates, the control gates do not exist between the floating gates that are adjacent in the word line direction.

Meanwhile, in flash memory devices according to the present embodiment, as described above, the control gates 15 is formed to completely surround the top and sides of the floating gates 13. The control gates are located between floating gates that are adjacent in the word line direction as well as the bit line direction.

Table 1 shows threshold voltage shift values due to interference among floating gates in the bit line (B/L) direction and the word line (W/L) direction in the prior art method and the flash memory device of the present embodiment.

TABLE 1

|  | 123 nm | | 90 nm | | 70 nm | |
| --- | --- | --- | --- | --- | --- | --- |
|  | Prior Art | Present Invention | Prior Art | Present Invention | Prior Art | Present Invention |
| W/L Direction | 0.29 V | 0 V | 0.32 V | 0 V | 0.45 V | 0 V |
| B/L Direction | 0.017 V | 0.012 V | 0.051 V | 0.037 V | 0 V | 0 V |

From Table 1, it can be seen that a shift in the threshold voltage due to interference among floating gates that are adjacent in the word line direction is significantly higher than those in the bit line direction, in the prior art method.

This is because interference is not mitigated since control gates do not exit between floating gates that are adjacent in the word line direction although control gates between floating gates that are adjacent in the bit line direction serve to mitigate interference among the floating gates.

Meanwhile, in the present embodiment, control gates are located between floating gates that are adjacent in the word line direction as well as in the bit line direction. Thus, the control gates serve to mitigate interference among the floating gates. From Table 1, it can be thus seen that a shift in a threshold voltage due to interference is lowered even in the word line direction.

A method of fabricating the flash memory device constructed above will now be described.

Figure 5:
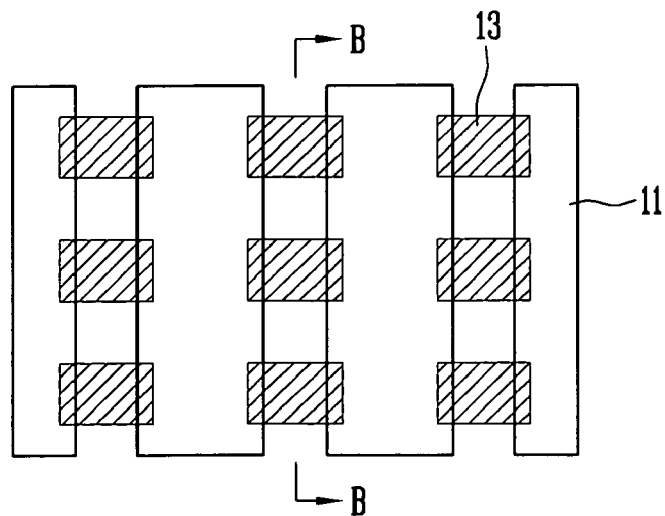
FIG. 5 is a plan view showing a flash memory device according to an embodiment of the present invention.
Figure 6A:
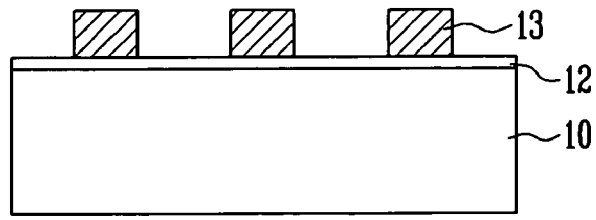
FIGS. 6a to 6c are cross-sectional views for explaining a method of fabricating a flash memory device according to an embodiment of the present invention.
Figure 6B:
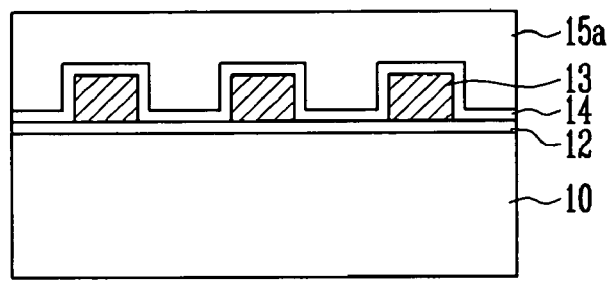
Figure 6C:
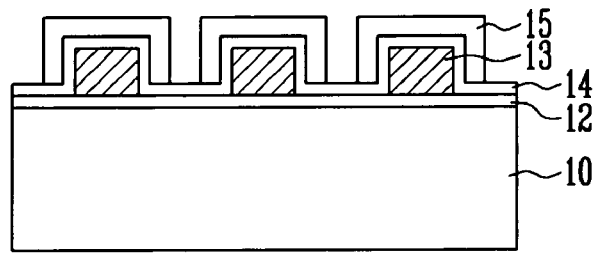

FIG. 5 is a plan view showing a flash memory device according to an embodiment of the present invention. FIGS. 6a to 6c are cross-sectional views for explaining a method of fabricating a flash memory device according to an embodiment of the present invention. FIG. 6a is a cross-sectional view of the flash memory device taken along line B-B in FIG. 5.

First, as shown in FIGS. 5 and 6a, an oxide film of about 80 Å in thickness is grown on a semiconductor substrate 10 in which an active region and a field region are defined by means of isolation films 11 formed through a typical method, thus forming a tunnel dielectric film 12.

A polysilicon film or a metal compound is deposited on the tunnel dielectric film 12 to form conductive layers for floating gate. The conductive layers for floating gate are patterned by means of a predetermined photolithography process, forming a plurality of floating gates 13 that are separated on a cell basis and have an island shape. At this time, the floating gates 13 can be formed in various shapes, such as polygonal, circular and oval shapes, as well as a square.

Conventionally, when the conductive layers for floating gate are patterned, the conductive layer for floating gate are formed in a stripe pattern that is aligned in a direction parallel to the isolation films. Upon etching of the control gates, the control gates are etched again in the bit line direction to separate the floating gate on a cell basis. If this method is employed, however, it is difficult to locate the control gates between the floating gates adjacent in the word line direction. Accordingly, in the present embodiments, the conductive layers for the floating gate are separated on a cell basis when patterning them.

Referring to FIG. 6b, an interlayer dielectric film 14 of about 50 Å in thickness is formed on the entire surface of the semiconductor substrate 10. A conductive layer 15a for control gate is formed on the interlayer dielectric film 14.

In this case, the interlayer dielectric film 14 is made to have a high selective ratio against the conductive layer 15a for the control gate so that etching is stopped on the interlayer dielectric film 14 upon patterning of the control gates.

For example, the interlayer dielectric film 14 can be formed using an oxide film, or a stack film of an oxide film and a nitride film, such as an oxide film/a nitride film/an oxide film (ONO). The conductive layer 15a for control gate is formed by depositing a conductive layer such as a polysilicon film or a metal compound.

Referring to FIG. 6c, the conductive layer 15a for the control gate is patterned by means of a photolithography and etch process, forming a control gates 15 of a stripe pattern, which completely surrounds the top and sides of the floating gates 13 and is aligned in a bit line direction perpendicular to a word line direction.

Figure 7:
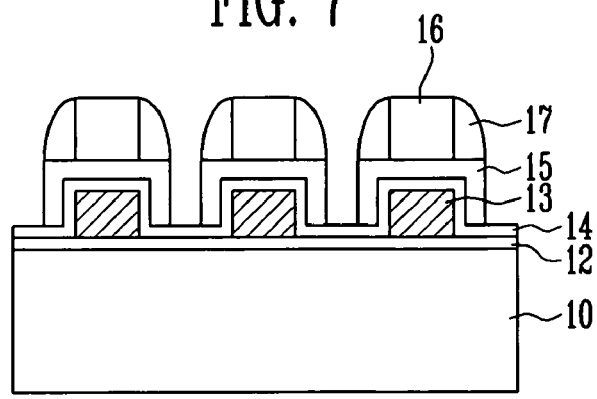
FIG. 7 is a view showing a control gate patterning process using a hard mask.

As devices become high integrated, the size of the control gates 15 becomes smaller than a resolution power of a stepper. If a process of patterning the conductive layer 15a for control gate is difficult, a hard mask film 16 is formed on the conductive layer 15a for control gate, as shown in FIG. 7. After the hard mask film 16 is patterned to the size that can be patterned, hard mask spacers 17 are formed at both sides of the patterned hard mask film 16. The conductive layer 15a for the control gate is etched using the hard mask film 16 and the hard mask spacers 17 as masks, thus forming control gates 15. At this time, the hard mask film 16 and the hard mask spacers 17 are preferably formed using an oxide film.

Since the interlayer dielectric film 14 and the conductive layer 15a for control gate have a high selective ratio, an etch process for patterning the control gates 15 is stopped on the interlayer dielectric film 14.

Meanwhile, a width in the word line direction of the control gates 15 corresponds to the sum of a width in the word line direction of the floating gates 13, twice a thickness of the interlayer dielectric film 14, and overlay margin. Further, the overlay margin corresponds to the sum of a minimum thickness of the control gates 15, which is formed at both sides of the floating gates 13 in the word line direction and can prohibit the interference effect, and misalignment margin.

The minimum thickness of the control gates 15 that are formed at both sides of the floating gates 13 in the word line direction is 5 nm in one of the sides of the floating gates 13, a total of 10 nm.

Though not shown in the drawings, a re-oxidization process is performed in order to mitigate etch damage in the patterning process of the control gates 15. At this time, a re-oxidized thickness is set to about 30 Å.

Accordingly, a thickness of the insulating film on a plane where the control gates 15 and the semiconductor substrate 10 are in contact with each other is the sum of a thickness of the tunnel dielectric film 12, a thickness of the interlayer dielectric film 14, a thickness of the nitride film and a thickness of the re-oxidization film. Since the tunnel dielectric film 12 is 80 Å, the interlayer dielectric film 14 is 50 Å, the nitride film is 50 Å and the re-oxidization film is 30 Å, the thickness of the insulating film is 200 Å or more. Accordingly, BV is 20 V or more.

In the flash memory device according to the present embodiment, since the control gates 15 fully surrounds the top and sides of the floating gates 13, the control gates 15 exist even between the floating gates 13 that are adjacent in the word line direction. Thus, the interference among the floating gates 13 in the word line direction is thus reduced. Accordingly, a shift in a threshold voltage due to the interference among the floating gates 13 is also reduced.

Furthermore, as the control gates 15 completely surrounds the floating gates 13, an overlapping area of the floating gates 13 and the control gates 15, i.e., the coupling ratio increases.

The following table shows improvement of the coupling ratio according to the present embodiment.

TABLE 2

|        | Coupling Ratio | | Ratio of Improved Coupling Ratio According to the |
|--------|---------|-------------------|-------------------|
|        | Prior Art | Present Invention | Present Invention |
| 120 nm | 0.733   | 0.843             | 1.151             |
| 90 nm  | 0.685   | 0.805             | 1.175             |
| 70 nm  | 0.672   | 0.797             | 1.187             |

As such, if the coupling ratio is improved, the operating voltage in a flash cell can be reduced by about 20%. That is, about 16 V can be reduced in an existing operating voltage 20V, and consumption current of a product can also be reduced by about 20%. Accordingly, the size of a high voltage transistor being a main element in a flash memory surrounding circuit can be reduced by about 20% or more, and the size of a pump stage that occupies most of a surrounding circuit area can be reduced by 20%. Accordingly, it is expected that the chip size can be reduced and the die yield can be increased.

As described above, the present embodiment has the following effects.

Firstly, since control gates are formed to completely surround floating gates, the interference among the floating gates that are adjacent through the control gates can be reduced. Accordingly, a MLC can be easily implemented because a shift in a threshold voltage due to the interference among the floating gates can be reduced.

Secondly, since control gates are formed to completely surround floating gates, an overlapping area between the control gates and the floating gates, i.e., the coupling ratio can be improved. Accordingly, a cell operating voltage and power consumption can be reduced.

Thirdly, since power consumption can be reduced, the size of a high voltage transistor of a surrounding circuit and the size of a pump can be reduced. It is possible to reduce the chip size and increased a total number of ties through a reduced size of a pump.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of fabricating a flash memory device, the method comprising:
   forming a tunnel dielectric film on a semiconductor substrate in which an active region and a field region are defined by isolation films;
   forming floating gates, which are separated in an island shape on a cell basis, over the active region and the field region adjacent to the active region;
   forming an interlayer dielectric film over a resulting surface;
   forming an electrode material over the interlayer dielectric film;
   forming a hard mask film pattern over a predetermined region of the electrode material;
   forming a hard mask spacer at the sides of the hard mask film pattern, and
   patterning the electrode material to form control gates that surround the top and sides of the floating gates using the hard mask film pattern and the hard mask spacer as masks.

2. The method as claimed in claim 1, wherein the hard mask film and the hard mask spacer are formed of an oxide film.

3. The method as claimed in claim 1, further comprising:
   performing a re-oxidization process for mitigating etch damage after the control gates are formed.

4. The method as claimed in claim 1, wherein the tunnel dielectric film is formed using an oxide film, and the interlayer dielectric film is formed using an oxide film or a stack film comprising an oxide film and a nitride film.

5. The method as claimed in claim 1, wherein the floating gates and the control gates are formed using polysilicon or a metal compound.

6. The method as claimed in claim 1, wherein a width of the control gates in a second direction is perpendicular to a first direction, wherein the floating gates overlap the isolation films in the first direction, the width of the control gates being substantially equal to the sum of: a width of the floating gates in the second direction, twice a thickness of the interlayer dielectric film, and an overlay margin.

7. The method as claimed in claim 1, wherein the floating gates are formed in the shape of one of: a square, a circle, an ellipse or a polygon.

* * * * *